United States Patent
Huffer et al.

(10) Patent No.: US 9,765,423 B2
(45) Date of Patent: Sep. 19, 2017

(54) COATED ARTICLES AND METHODS OF MAKING SAME

(71) Applicant: APOGEE ENTERPRISES, INC., Minneapolis, MN (US)

(72) Inventors: Russell Huffer, Eden Prairie, MN (US); Randy Leland Stull, Owatonna, MN (US); Henry Boyum, Waseca, MN (US); Keith Grubb, Faribault, MN (US); Kristin Sumner, Brownsdale, MN (US)

(73) Assignee: APOGEE ENTERPRISES, INC., Minneapolis, MN (US)

( * ) Notice: Subject to any disclaimer, the term of this patent is extended or adjusted under 35 U.S.C. 154(b) by 210 days.

(21) Appl. No.: 14/639,478

(22) Filed: Mar. 5, 2015

(65) Prior Publication Data
US 2015/0197843 A1    Jul. 16, 2015

Related U.S. Application Data

(62) Division of application No. 13/052,779, filed on Mar. 21, 2011, now Pat. No. 9,005,737.

(51) Int. Cl.
*C23C 14/06* (2006.01)
*C03C 17/00* (2006.01)
(Continued)

(52) U.S. Cl.
CPC ............ *C23C 14/06* (2013.01); *C03C 17/002* (2013.01); *C03C 17/36* (2013.01); *C03C 17/366* (2013.01); *C23C 14/35* (2013.01); *B32B 3/263* (2013.01); *B32B 17/10201* (2013.01); *B32B 17/10431* (2013.01); *B32B 2250/02* (2013.01); *B32B 2255/28* (2013.01); *C03C 2218/156* (2013.01);
(Continued)

(58) Field of Classification Search
CPC ..... C03C 17/002; C03C 17/366; C03C 17/36; C03C 14/06; C03C 14/35; C03C 2218/14; C03C 2218/34; B32B 17/10201; B32B 17/10431; B32B 2255/28; B32B 3/263; B32B 2250/02
See application file for complete search history.

(56) References Cited

U.S. PATENT DOCUMENTS 165,811 A    7/1875  Feix
165,812 A    7/1875  Fletcher
(Continued)

FOREIGN PATENT DOCUMENTS

CH    469 180      2/1969
FR    2 878 844    6/2006
(Continued)

OTHER PUBLICATIONS

"Impact of Coated Windows on Visual Conception", Marie-Claude Dubois et al., pp. 1-35, Jan. 1, 2003.
(Continued)

*Primary Examiner* — Donald J Loney
(74) *Attorney, Agent, or Firm* — Dorsey & Whitney LLP (57) ABSTRACT

A coated substrate. The coated substrate includes a unitary substrate having a major surface. A first coating is applied to a first surface segment of the major surface. A second coating applied to a second surface segment of the major surface. The first coating is different than the second coating.

17 Claims, 9 Drawing Sheets

(51) Int. Cl.
*C03C 17/36* (2006.01)
*C23C 14/35* (2006.01)
*B32B 3/26* (2006.01)
*B32B 17/10* (2006.01)

(52) U.S. Cl.
CPC ..... *C03C 2218/34* (2013.01); *Y10T 428/2495* (2015.01); *Y10T 428/24612* (2015.01); *Y10T 428/24917* (2015.01); *Y10T 428/24926* (2015.01); *Y10T 428/24942* (2015.01); *Y10T 428/31504* (2015.04)

(56) References Cited

U.S. PATENT DOCUMENTS

| | | | |
|---|---|---|---|
| 2,239,528 | A | 4/1941 | Knudsen |
| 2,739,863 | A | 3/1956 | Ferris |
| 2,925,634 | A | 2/1960 | Ewing |
| 3,009,389 | A | 11/1961 | Ewing |
| 3,077,643 | A | 2/1963 | Horner |
| 3,120,883 | A | 2/1964 | Greilling |
| 3,236,290 | A | 2/1966 | Lueder |
| 3,260,026 | A | 7/1966 | Bacon |
| 3,324,620 | A | 6/1967 | Requena |
| 3,800,451 | A | 4/1974 | Bulkley |
| 3,846,152 | A | 11/1974 | Franz |
| 4,035,539 | A | 7/1977 | Luboshez |
| 4,316,337 | A | 2/1982 | Da Costa |
| 4,409,960 | A | 10/1983 | Balzer |
| 4,790,922 | A | 12/1988 | Huffer |
| 4,883,721 | A | 11/1989 | Nalepka et al. |
| 4,902,081 | A | 2/1990 | Huffer |
| 5,562,951 | A | 10/1996 | Kamen |
| 5,743,038 | A | 4/1998 | Soto |
| 5,778,258 | A | 7/1998 | Zamoyski |
| 7,055,976 | B2 | 6/2006 | Blanford |
| 7,220,019 | B2 | 5/2007 | Cheung et al. |
| 7,632,572 | B2 * | 12/2009 | Glenn ............... C03C 17/36 427/404 |
| 7,654,023 | B2 | 2/2010 | Peters et al. |
| 7,864,264 | B2 | 1/2011 | Sato et al. |
| 7,884,904 | B2 | 2/2011 | Wada |
| 2006/0115655 | A1 | 6/2006 | Krisko et al. |
| 2009/0015924 | A1 | 1/2009 | Mitchell |
| 2009/0139120 | A1 | 6/2009 | Albert |
| 2009/0246476 | A1 | 10/2009 | Mennechez et al. |
| 2010/0244732 | A1 | 9/2010 | Kracht et al. |
| 2010/0308061 | A1 | 12/2010 | Loulourgas |
| 2011/0176212 | A1 | 7/2011 | Lu et al. |

FOREIGN PATENT DOCUMENTS

| | | |
|---|---|---|
| GB | 528 796 | 11/1940 |
| JP | S50-014787 Y | 0/1975 |
| JP | S63265499 | 11/1988 |
| WO | 2006019668 | 8/2006 |
| WO | WO 2010/053921 | 5/2010 |
| WO | 2010107998 | 9/2010 |

OTHER PUBLICATIONS

PCT International Search Report and Written Opinion, Application No. PCT/US2012/061547, dated Feb. 4, 2013.
Viracon, "Insulating Glass Specs & Tech"; date unknown.
Marie-Claude Dubois,Impact of Coated Windows on Visual Perception, [Online], Jan. 1, 2003, p. 1-35, URL: http://vbn.aau.dk/files/14366147/Dokumentation044/pdf.
Japanese Official Action issued Aug. 16, 2016, 6 pages including translation, for related Japanese Patent Application No. 2014-538897.

* cited by examiner

COATED ARTICLES AND METHODS OF MAKING SAME

CROSS-REFERENCE TO RELATED APPLICATIONS

This application is a Divisional of U.S. application Ser. No. 13/052,779 filed on Mar. 21, 2011, issued as U.S. Pat. No. 9,005,737 on Apr. 14, 2015, the contents of which are herein incorporated by reference in its entirety.

FIELD OF THE INVENTION

In a first inventive aspect, the present disclosure relates to coatings for substrates or substrate surfaces. In a second inventive aspect, the present disclosure relates to systems and methods for affecting and/or enhancing distribution of visual light transmitted through an insulating glass unit.

BACKGROUND

Advances in window technology have reduced energy consumption in buildings by affecting and improving heating, cooling, and lighting properties of the windows. Often, such advances involve the application of coatings that affect thermal and/or transmission properties of the window. For example, coatings may be applied to a window to reduce radiative heat transfer, increase visual light transmittance, reduce glare, etc.

Low-emissivity ("low-e") coatings are known. These coatings commonly include one or more reflective metal layers and two or more transparent dielectric layers. Low-e coatings generally have a high reflectance in the thermal infrared and, depending on the particular configuration, can have varying overall solar performance in terms of performance indicators such as "solar heat gain coefficient" and "shading coefficient." A tradeoff is sometimes made in higher solar performing low-e coatings whereby the films selected to achieve the higher solar performance have the effect of restricting the amount of visible light that is transmitted through the window. As a consequence, windows bearing these coatings may not allow a sufficient amount of natural daylight into a building space. Therefore, it may be desirable to include windows having both high solar performance and high visual light transmission in the same building space. Currently, however, the only means to achieve both of these characteristics in the same building space is to provide separate windows each bearing one of the respective coatings. Each of these separate windows must then be installed with its own framing, thereby reducing the maximum glass to wall ratio that may be achieved in the building space, and increasing installation costs relative to that of a single window.

Therefore, systems and methods that provide for high solar performance and high visual light transmission in a single window sheet may be desirable. Additionally, systems and methods that maximize the effect and/or enhance distribution of the visual light transmitted through such single sheets within a building space may be desirable.

SUMMARY OF THE INVENTION

In one embodiment, the present disclosure relates to a coated substrate. The coated substrate includes a unitary substrate having a major surface. A first coating is applied to a first surface segment of the major surface. A second coating is applied to a second surface segment of the major surface. The first coating is different than the second coating.

In one embodiment, the present disclosure relates to a method of producing coated substrates. The method includes providing a substrate having a major surface, depositing upon a first surface segment of said major surface a first coating, depositing upon a second surface segment of said major surface a second coating. The first coating is different than the second coating.

In one embodiment, the present disclosure relates to an insulating glass unit. The insulating glass unit includes at least two substantially parallel, spaced sheets of glass. The at least two sheets of glass are sealed together at their peripheral edges to define an insulating chamber. One of the sheets includes a major surface. A first coating is applied to a first surface segment of the major surface. A second coating is applied to a second surface segment of the major surface. The first coating is different than the second coating.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

DETAILED DESCRIPTION OF THE INVENTION

A first inventive aspect of the present disclosure relates to an article or substrate having a coating thereon. More particularly, a first inventive aspect is directed to a substrate having one or more coatings selectively positioned thereon such that one or more properties (e.g., visible light transmittance, infrared transmittance, emissivity, solar heat gain, shading, color, etc.) of a first segment of the substrate are different than those properties in other segments of the substrate. For example, in accordance with the first inventive aspect, a substrate having a major surface may have a first coating provided on a first surface segment of the major surface, a second coating provided on a second surface segment of the major surface, and so on, each of the coatings imparting different characteristics or properties to their respective surface segments. Alternatively, a substrate having a major surface may have a first coating provided on a first surface segment of the major surface and one or more uncoated surface segments of the major surface. The first inventive aspect also relates to methods for forming segmentally coated substrates.

Figure 1:
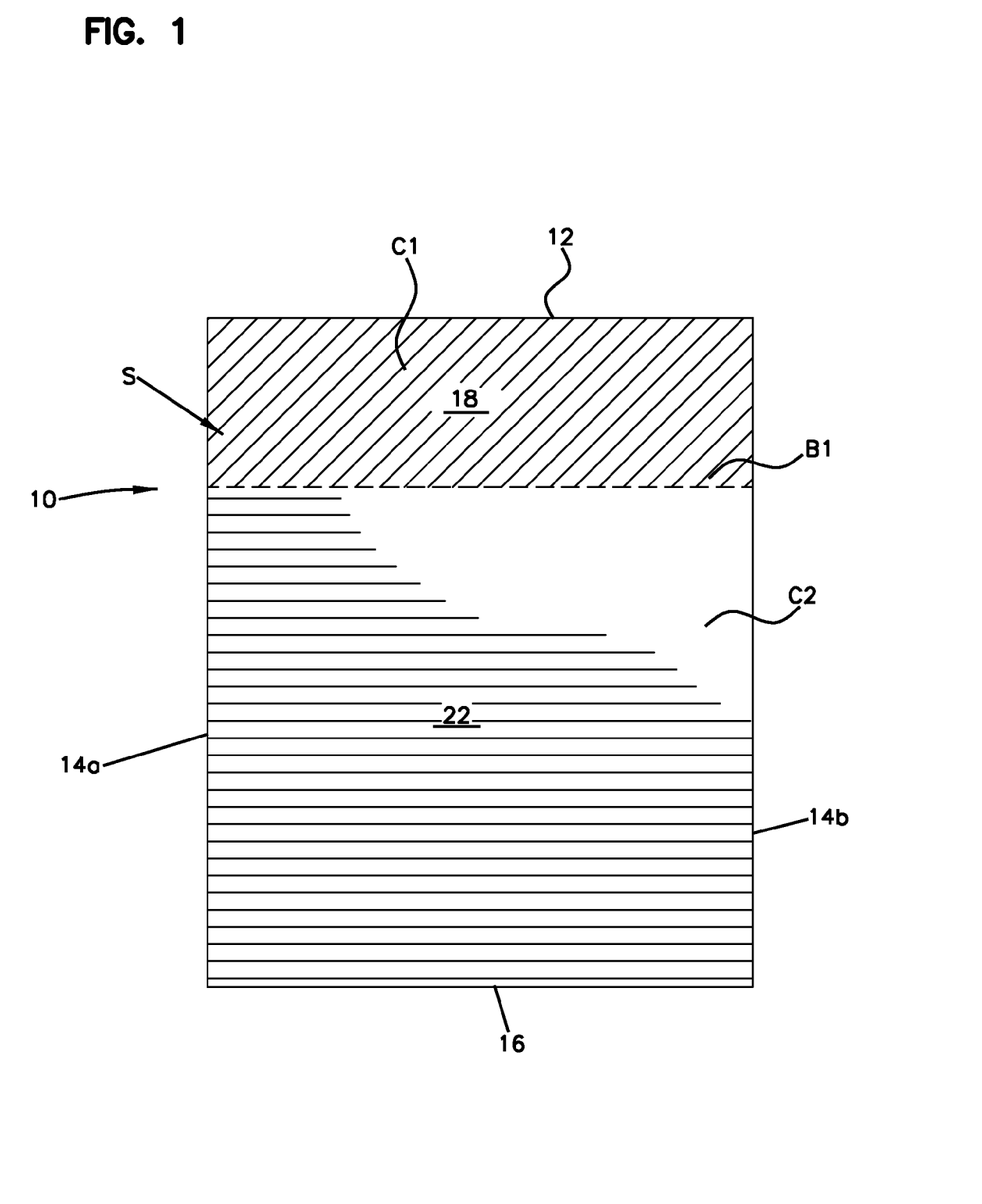
FIG. 1 is a diagram illustrating a segmentally coated substrate according to one embodiment of the present disclosure.

Referring now to FIG. 1, a major surface S of a segmentally coated substrate 10 having a top edge 12, opposed side edges 14a, 14b, and a bottom edge 16 is illustrated. In illustrative embodiments, the surface S may include a first segment 18, defined by the top edge 12, side edges 14a, 14b, and a boundary B1, having a first coating C1 applied thereto, and a second segment 22 defined by the bottom edge 16, side edges 14a, 14b, and the boundary B1, having a second coating C2 applied thereto. Generally, the first coating C1 may be configured relative to the second coating C2 such that the first segment 18 exhibits one or more properties (e.g., e.g., visible light transmittance, infrared transmittance, emissivity, solar heat gain, shading, color, etc.) that differ with respect to that of the second segment 22. While the present disclosure is described with respect to embodiments in which the substrate 10 includes two segments having different coatings applied thereto, it is to be appreciated that substrates having any number of additional segments having the same and/or different coatings are within the scope of the present disclosure.

In some embodiments, suitable substrates 10 may be any transparent, substantially transparent, or light transmissive substrate such as glass, quartz, any plastic or organic polymeric substrate, or any other suitable material or combination of materials. Further, the substrates 10 may be a laminate of two or more different materials and may be a variety of thicknesses. The substrates 10 may be configured to exhibit properties, apart from a film or coating, such as, for example, as can be accomplished by controlling the iron content in a glass substrate. In one embodiment, the substrate may be float glass. The substrates 10 can have any shape and dimension which are appropriate for their intended purpose. For example, the substrates 10 can be round, square, rectangular, polygonal, an irregular shape, or combinations thereof. The substrate 10 may be used in a variety of arrangements and settings where control of reflectance and transmittance is required or desired. For example, the substrate 10 may be part of a window, skylight, door, or other glazing (e.g., an automobile glazing).

In illustrative embodiments, the coatings C1 and C2 may be applied over a major surface S of the substrates 10 and be arranged in a single layer or a layer system composed of a plurality of layers. The layers of a layer system may be provided in a contiguous relationship, directly on top of or adjacent to other layers of the system or the substrate. The thickness of an individual layer or the layer system may be uniform, or may vary across its width or length.

In some embodiments, either or both of the coatings C1 and C2 may be configured as low-emissivity coatings. The low-emissivity coatings may be formed of a metal layer, a metal oxide layer, or combinations thereof. In one embodiment, the low-emissivity coatings may be applied as layer systems including a plurality of dielectric layers (e.g., oxides of oxides of zinc, tin, indium, bismuth, titanium, hafnium, zirconium, and alloys thereof) having one or more metal layers (e.g. silver, copper, gold, platinum, palladium, alloys thereof) disposed between adjacent dielectric layers. Alternatively, or additionally, other materials or layers may be placed between the respective dielectric layers.

In illustrative embodiments, as shown in FIG. 1, the coatings C1 and C2 may be applied to the substrate 10 such that a boundary B1, which defines the first and second segments 18, 22, is formed as a straight line extending substantially parallel to the top and bottom edges 12, 16. Alternatively, the boundary B1 may be angled, curved, or segmented such that it may be combinations thereof. The boundary B1 may be positioned at any point between the top and bottom edges 12, 16. The boundary B1 may positioned such that the surface area of the first segment 18 is about 1-90%, in accordance with a first embodiment, between approximately 5-70% in accordance with another embodiment, and between about 10-40% in accordance with yet another embodiment, of the total surface area of the surface S. Generally, the first and second segments 18, 22 may be sized relative to each other as appropriate for the intended purpose of the segmentally coated substrate 10.

As discussed above, the first coating C1 may be configured relative to the second coating C2 such that the first segment 18 of the substrate S exhibits one or more properties that differ with respect to that of the second segment 22. In some embodiments, such variation in the properties of the segments 18, 22 may be achieved by varying a layer system of the first coating C1 relative to a layer system of the second coating C2. For example, the layer system of the first coating C1 may include one or more additional layers, one or more fewer layers, one or more layers having greater thickness, one or more layers having lesser thickness, and/or one or more layers of a different material relative to the layer system of the second coating C2. By varying the layering arrangements of the coatings C1 and C2 in this manner, the properties exhibited by the first segment 18 may be varied relative to those properties of the second segment 22 to achieve a segmentally coated substrate exhibiting a combination of properties in a desired arrangement.

In some embodiments, the layer system of the first coating C1 may be configured substantially similarly (e.g., with respect to material, thickness, etc.) to a layer system of the second coating C2. For example, the coatings C1 and C2 may be formed as layer systems that are substantially identical except for variations in one or more discrete layers (i.e., a plurality of the layers of the coatings are substantially identical and one or more discrete layers are different). Alternatively, the coatings C1 and C2 may be formed as substantially different layer systems (i.e., none of the layers or a minority of the layers are substantially identical).

In various embodiments, depending on the application technique, the transition between the coatings C1 and C2 may be gradual. For example, in an embodiment in which the coating C1 has one or more additional layers, fewer layers, or layers of a different material relative to the coating C2, such layer modification may occur gradually over a transitional segment of the surface S before reaching its final configuration in the coating C2 (e.g., a layer may have a graded thickness over a transitional segment of the surface S before reaching a final thickness in the coating C2). Providing gradual transitions in this manner may "soften"

any visually detectable differences (e.g., color, reflective properties) in the first and second segments 18, 22, thereby producing segmentally coated substrates that are more aesthetically pleasing. The length of the transitional segment may be selected to achieve any desired degree of "softening."

In various embodiments, the coatings C1 and C2 may be configured such that the first segment 18 exhibits a visible light transmission that is higher than the visible light transmission of the second segment 22. In one embodiment, the first segment 18 may be a so-called high transmission area (visible light transmissions of about 60% or higher) and the second segment 22 may be a so-called low transmission area (visual light transmissions of about 40% or lower). Additionally or alternatively, the coatings C1 and C2 may be configured such that the second segment 22 exhibits superior solar performance (e.g., lower solar heat gain coefficient, lower shading coefficient, etc.) relative to the first segment 18. Other properties of the first and second segments 18, 22 may be additionally or alternatively varied relative to one another.

Figure 2:
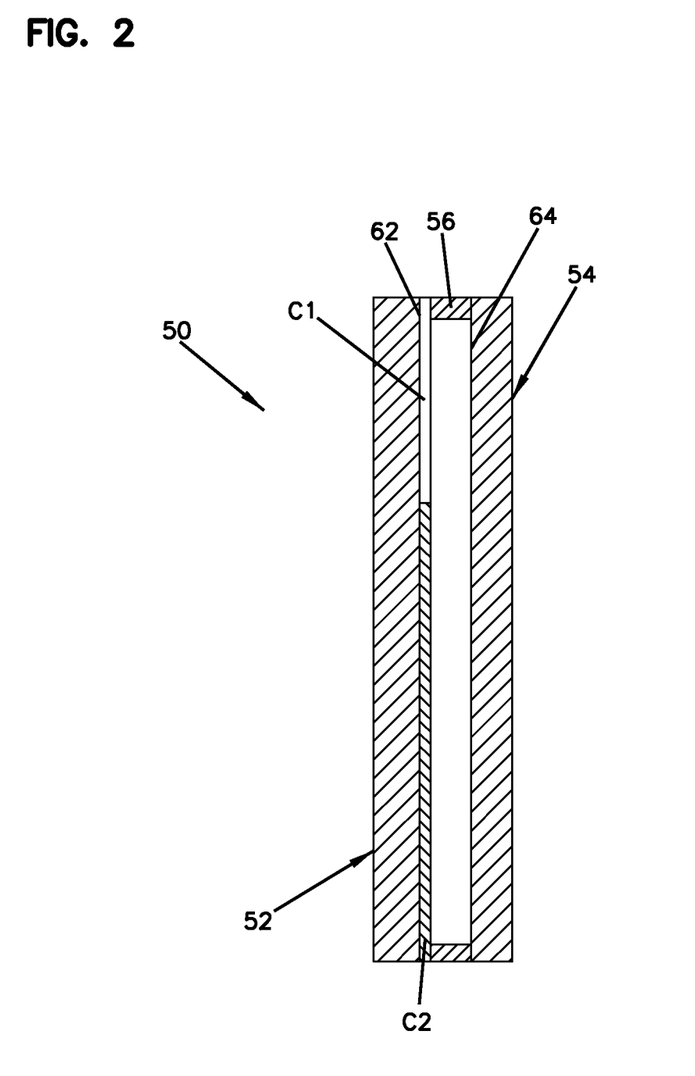
FIG. 2 is a cross-sectional side view of a segmentally coated substrate incorporated into a insulating glass unit according to one embodiment of the present disclosure.

FIG. 2 depicts a segmentally coated substrate in accordance with the first aspect of the present disclosure, which has been incorporated into an insulating glass (IG) unit 50. As shown in FIG. 2, an IG unit 50 may be formed as a multi-pane window having a first pane, or lite 52, and a second pane, or lite 54, sealed at their peripheral edges by a sealant 56 to form a chamber 58 therebetween. By sealing the peripheral edges of the lites 52, 54 and introducing a low-conductance gas, such as argon, air, krypton, or the like, into the chamber 58, a high insulating value IG unit 50 may be formed. In one embodiment, one or more surfaces of the lites 52, 54 may be segmentally coated in a manner similar to that described with respect to FIG. 1. That is, one or more surfaces of the lites 52, 54, such as either or both of the inner surfaces 62, 64 may have a first coating C1 applied to a first surface segment thereof, and a second coating C2 applied to a second surface segment thereof (FIG. 2 illustrates the first and second coatings applied to the inner surface 62). FIG. 2 illustrates only one embodiment of an IG unit in which the segmentally coated substrates of the present disclosure may be employed. For example, the segmentally coated substrates of the present disclosure may employed in an IG unit having three or more panes.

The first inventive aspect of the present disclosure further includes methods for forming the above-discussed segmentally coated substrates. A variety of methods may be used to apply the coatings, or the films or layers that form the coatings. The coatings may be deposited in one or more of a series of discrete layers, or as a thickness of graded film, or combinations thereof. The coatings may also be deposited using any suitable thin film deposition technique, such as sputter depositing or plasma chemical vapor deposition. Sputter deposition techniques may include, for example, diode sputtering, magnetron sputtering, confocal sputtering, direct sputtering, etc.

In some embodiments, a method for forming segmentally coated substrates may include positioning a substrate at the beginning of a magnetron sputting coater system and conveying the substrate, by conveyor assembly, through a plurality of discrete coat zones in which the various films or layers that make up the coating are sequentially applied. It is understood that conveying may be accomplished by any suitable means, mechanical, computerized, or by hand operation. In one example, the conveyance of the substrate may be by transport rollers on a conveyor assembly. Each coat zone may be provided with one or more sputtering chambers or bays adapted to deposit a film or layer on the substrate. In each of the bays, one or more targets including a sputterable target material may be mounted. The number and type of sputtering targets, i.e., planar or cylindrical, and the like, can be varied for manufacturing or other preferences. The layers may be sputtered from metallic or dielectric sources or targets, and the sputtering may occur in an inert or reactive atmosphere. The thickness of the deposited film may be controlled by varying the speed of the substrate and/or by varying the power placed upon the targets.

In some embodiments, the methods for forming segmentally coated substrates may include masking, or selectively placing one or more objects, such as a shield, a screen, or other suitable obstruction between the sputtering target and the substrate in one or more of the coat zones. By selectively shaping and placing such obstructions in a particular zone, the film or layer applied in a particular coat zone may be varied across the surface of the substrate.

In various embodiments, in addition to or in lieu of masking, the methods for forming segmentally coated substrates may include manipulating the reactive or ionized gases employed in a particular zone. For example, the types, volumes, directions, and/or source locations of the reactive gases within one or more coat zones may be varied to achieve a film or layer that is selectively varied across the surface of the substrate.

The systems and methods of the first inventive aspect relate, in some embodiments, to a single unitary substrate, such as a window sheet, having a first segment exhibiting certain properties or characteristics and a second segment exhibiting properties or characteristics that are different than that of the first segment. Providing two segments of a single window sheet with different characteristics or properties offers several advantages over providing the same two characteristics in separate windows mounted adjacent one another. For example, because each window must be mounted in its own framing, providing the two characteristics in separate windows requires additional framing to be installed, thereby reducing the maximum glass to wall ratio that may be achieved. Moreover, the installation costs for two separate windows are significantly higher than for a single window.

Example of First Inventive Aspect

Figure 3:
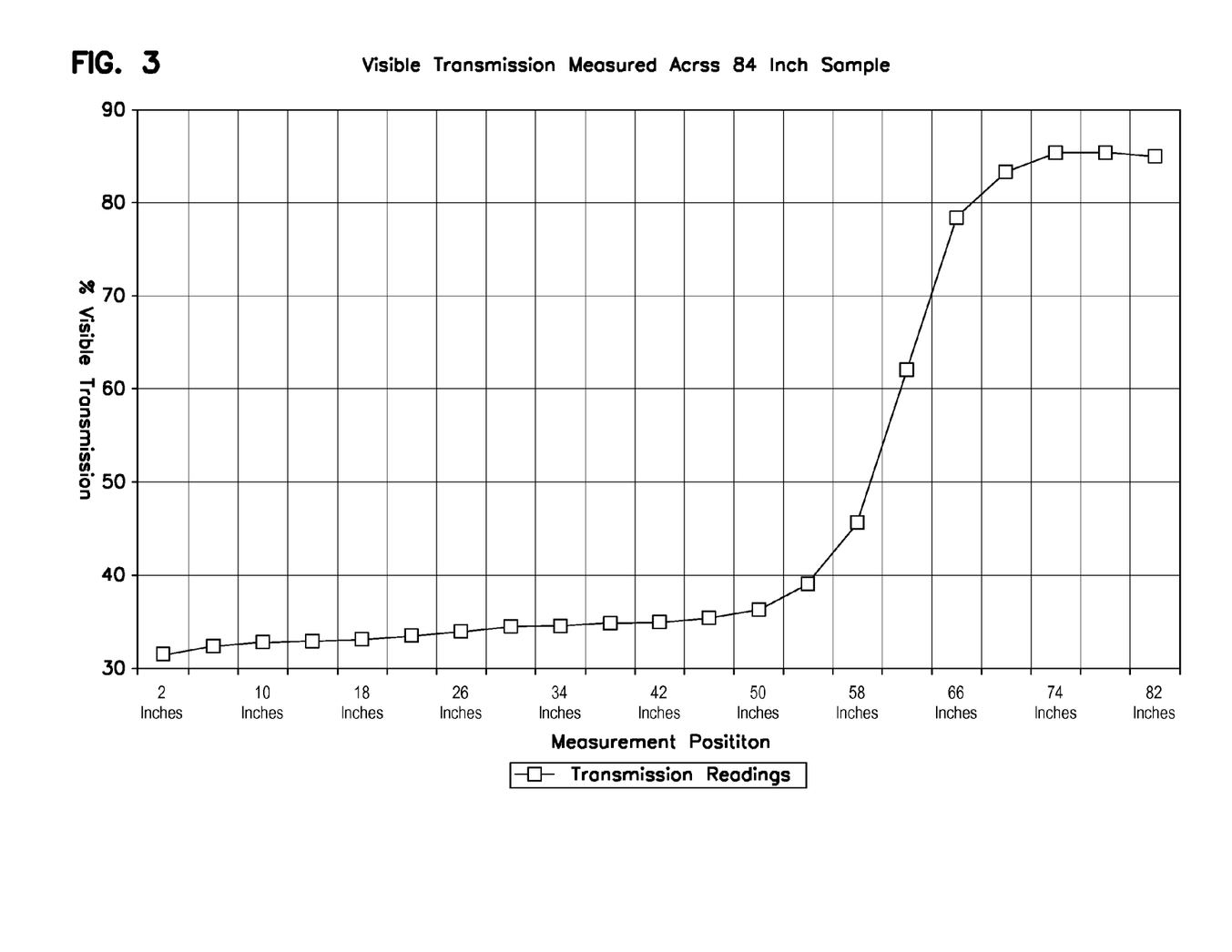
FIG. 3 is a graph, showing percent visual light transmission values of a segmentally coated sheet at various positions along the length of the sheet.

A sheet of clear annealed glass having a length of 84 inches, a width of 30 inches, and a thickness of 6 millimeters was coated using magnetron sputtering. Starting from a top edge of the sheet, a first low-emissivity coating was applied over an upper segment of the sheet and a second low-emissivity coating was deposited over a lower segment of the sheet. Transition between the first coating and the second coating was achieved by manipulation of the reactive gas employed during the sputtering process. The coated sheet was tested for visible light transmission in accordance with the National Fenestration Rating Council (NFRC) procedures for determining visible transmittance at normal incidence. FIG. 3 illustrates the results of the testing as measured % visible light transmission vs. measurement position along the sheet. As can be seen from the foregoing example, the coating systems and methods of the present disclosure may provide a single sheet of coated glass that has a first surface segment exhibiting high visible light transmission and a second surface segment exhibiting low visible light transmission.

A second inventive aspect of the present disclosure relates to an insulating glass unit having one or more incident light redirecting devices associated therewith. More particularly, a second inventive aspect is directed to an insulating glass unit having one or more incident light redirecting devices mounted within an interior chamber of the insulating glass unit. Generally, the incident light redirecting devices may be positioned and configured to receive incoming natural light through a portion of the IG unit 100 and reflect or otherwise redirect the light into a building space in a desired fashion.

Figure 4:
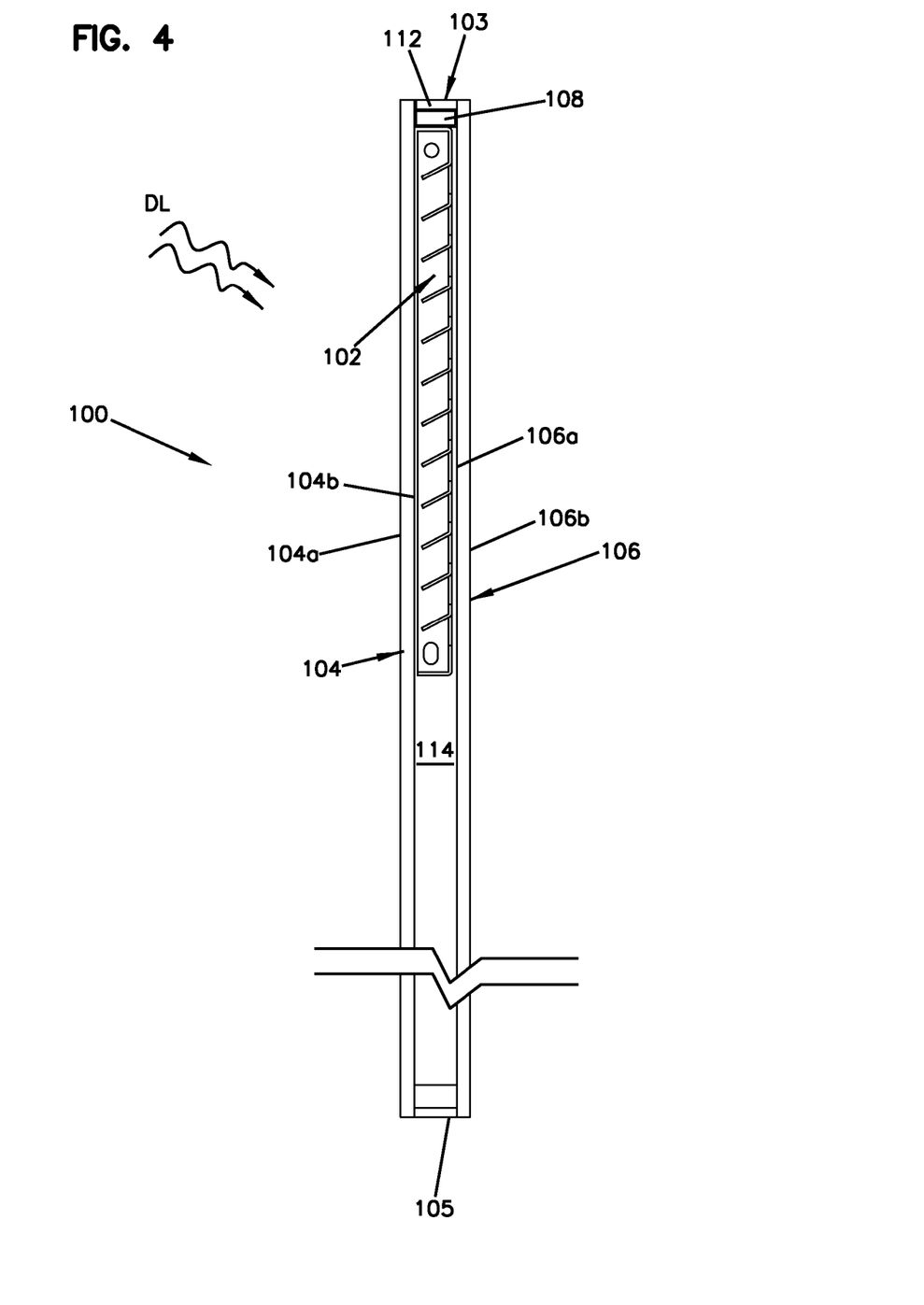
FIG. 4 is a cross-sectional side view of an insulating glass unit having a light redirecting device associated therewith according to one embodiment of the present disclosure.

Referring now to FIG. 4, an insulating glass unit 100 defining a top edge 103, opposed side edges, and a bottom edge 105, may have a light redirecting device 102 associated therewith. The insulating glass unit 100 may be formed as a multi-pane window having a first pane, or lite 104, and a second pane, or lite 106, provided in a spaced-apart relationship by a spacer 108, that are sealed at their peripheral edges by a sealant 112 to form a sealed chamber 114. A low-conductance gas, such as argon, air, krypton, or the like, may be present in the sealed chamber 114. The device 102 may be mounted within the sealed chamber 114.

In some embodiments, the IG unit 100 may be configured for mounting in a wall of a building. In such embodiments, a "first" (or "#1") surface 104a may be defined as that surface of the exterior-most sheet of the IG unit 100 that faces the outdoor environment. Accordingly, it may be the #1 surface 104a of the IG unit 100 that natural daylight DL first strikes. Moving from the #1 surface toward an interior side 101, the next surface may be referred to as the "second" (or "#2") surface 104b. Moving further toward the interior side 101, the next surface may be referred to as the "third" (or "#3") surface 106a, followed by the "fourth" (or "#4") surface 106b.

In illustrative embodiments, the lites 104, 106 can be formed of any transparent, substantially transparent, or light transmissive material such as glass, quartz, any plastic or organic polymeric substrate, or any other suitable material or combination of materials. Further, the lites 104, 106 may be a laminate of two or more different materials and may be a variety of thicknesses. In one embodiment, the lites 104, 106 may be float glass. The lites 104, 106 can have any shape and dimension which are appropriate for their intended purpose. For example, the lites 104, 106 can be round, square, rectangular, polygonal, an irregular shape, or combinations thereof.

In various embodiments, the spacer 108 may be formed in one or more sections and extend around a perimeter of the IG unit 100 to maintain the lites 104, 106 in spaced-apart relation. The spacers 108 may be formed as flat, plate-like members or, as shown, as solid or hollow tubing. While a rectangular cross-section of the spacer 108 is shown, the spacer 108 can be provided in a variety of cross sectional configurations. The spacer 108 may be formed of one or more materials including, but not limited to aluminum, steel, alloy, or other metal material. Other materials may also include composites, plastics, or wood. The spacers 108 may be secured between the lites 104, 106 by friction fitting, a fastening mechanism (e.g., adhesive), or combinations thereof.

Figure 5:
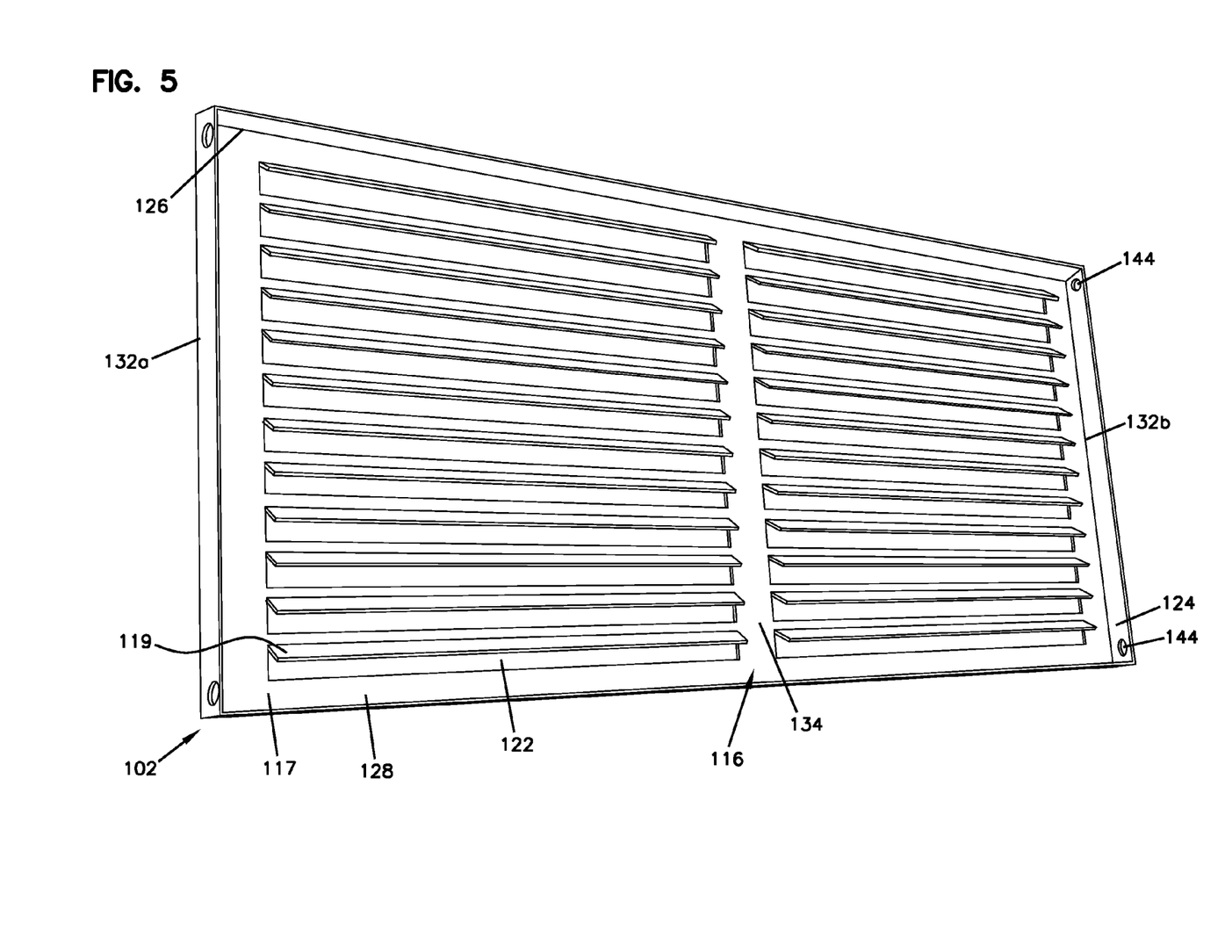
FIG. 5 is a perspective front view of a light redirecting device according to one embodiment of the present disclosure.
Figure 6:
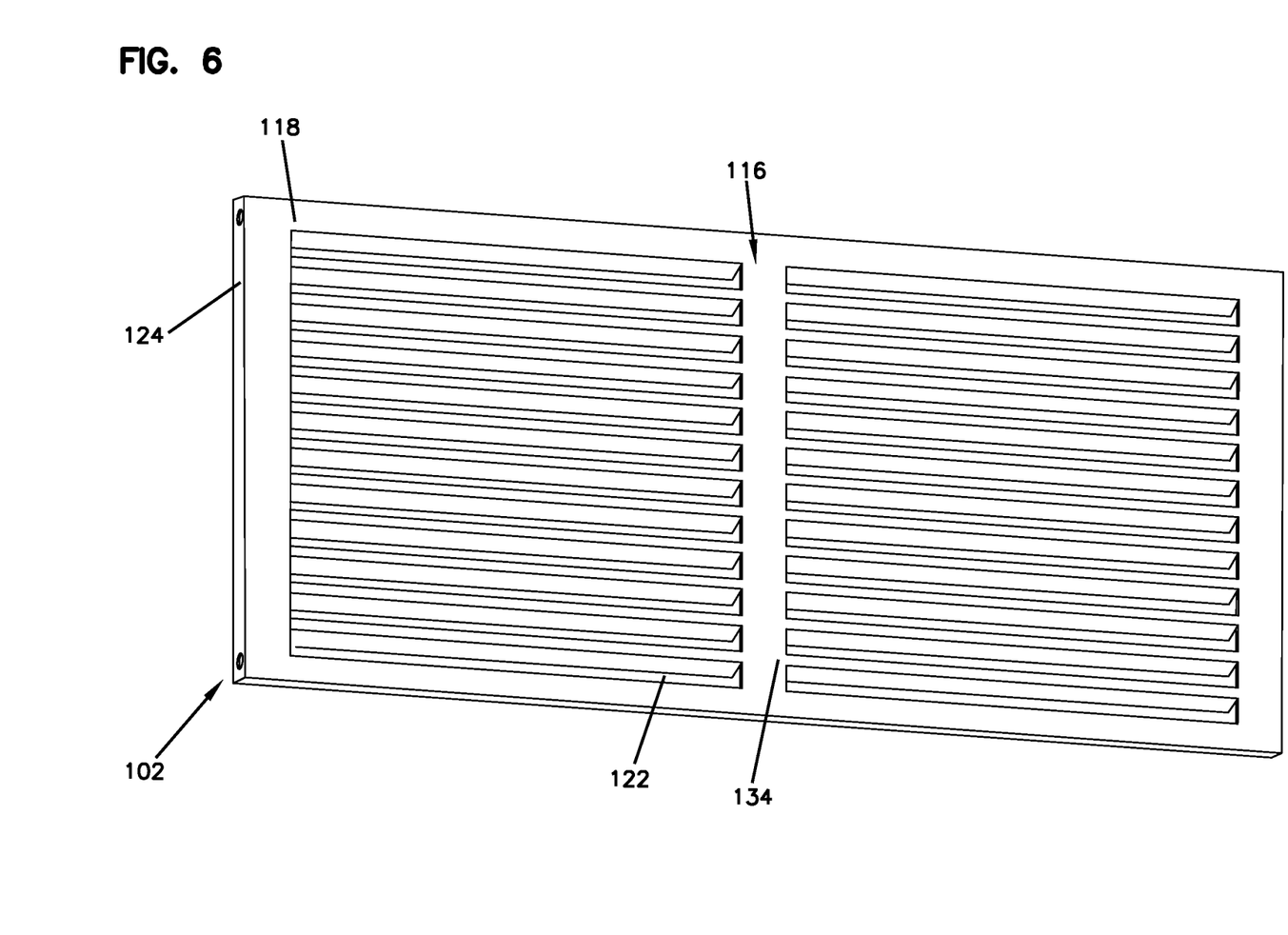
FIG. 6 is a perspective rear view of a light redirecting device according to one embodiment of the present disclosure.

Referring now to FIGS. 5-6, perspective front and back views, respectively, of a light redirecting device 102 in accordance with some embodiments of the present disclosure are illustrated. Generally, the light redirecting device 102 may be configured to receive natural incoming light and reflect the same upward into an interior space, thereby providing indirect lighting to the interior space. Indirect lighting may offer several advantages over direct lighting. For example, indirect lighting often results in spaces that feature more balanced brightness and visual comfort. Additionally, it often yields economic and environmental benefits by allowing overhead electrical lighting to be dimmed or turned off, thereby conserving energy. Still further, it reduces the amount of glare and resulting eye strain experienced by occupants of the building space, such as that observed during viewing of electronic display screens.

In illustrative embodiments, the device 102 may be configured as a louver-type device including a base member 116 having a daylight facing, or front face 117, a back face 118, a plurality of blades or slats 119 extending from the front face 117, and a plurality of openings 122 formed in and extending through the base member 116. The device 102 may further include a rim or flange member 124 to facilitate mounting of the device 102 within the chamber 114 of the IG unit 100.

In some embodiments, the base member 116, and its faces 117, 118, may be formed as a substantially planar, elongated members having a top edge 126, a bottom edge 128, and opposed side edges 132a, 132b. While the base member 116 of FIGS. 5-6 is formed as a rectangular member, it is to be appreciated that the base member can have any shape and dimension which is appropriate for its intended purpose. For example, the base member can be round, square, polygonal, an irregular shape, or combinations thereof. As another example, the base member 116 can be sized and shaped to conform to the size and shape of an insulating glass unit in which the device 102 is to be mounted (i.e., one or more of the edges of the base member 116 may generally conform with one or more edges of an insulating glass unit). The base members 116 may be formed of one or more materials including, but not limited to aluminum, steel, alloy, or other metal material. Other materials may also include composites, plastics, or wood. The base member 116 may be provided with one or more coatings or finishes to, for example, enhance the appearance of the base member 116, protect the base member 116, and/or modify the reflective properties of the base member 116.

In various embodiments, the slats 119 may be formed as elongated members protruding from the front face 117, which longitudinally extend substantially parallel to the top and bottom edges 126, 128. The slats 119 may extend across substantially the entire front face 117. Alternatively, as shown in FIGS. 5-6, the slats 119 may be interrupted by one or more transverse members 134 formed by the base member 116. It is to be appreciated that the number and width of the transverse members 134 may be varied to accommodate a desired configuration of the device 102. In one embodiment, the slats 119 may be integrally formed with respect to the base member 116 (i.e., the slats 119 may be formed by a series of cuts and/or bends of the base member 116). Alternatively, the slats 119 may be separate components coupled to the front face 117 by means of adhesives, butt welding, plug welding, lap welding, riveting, nailing, gusseting, crimping, or the like. The slats 119 may be formed of one or more materials including, but not limited to aluminum, steel, alloy, or other metal material. Other materials may also include composites, plastics, or wood. In one embodiment, the slats 119 and base member 116 may be formed of the same material.

Figure 7:
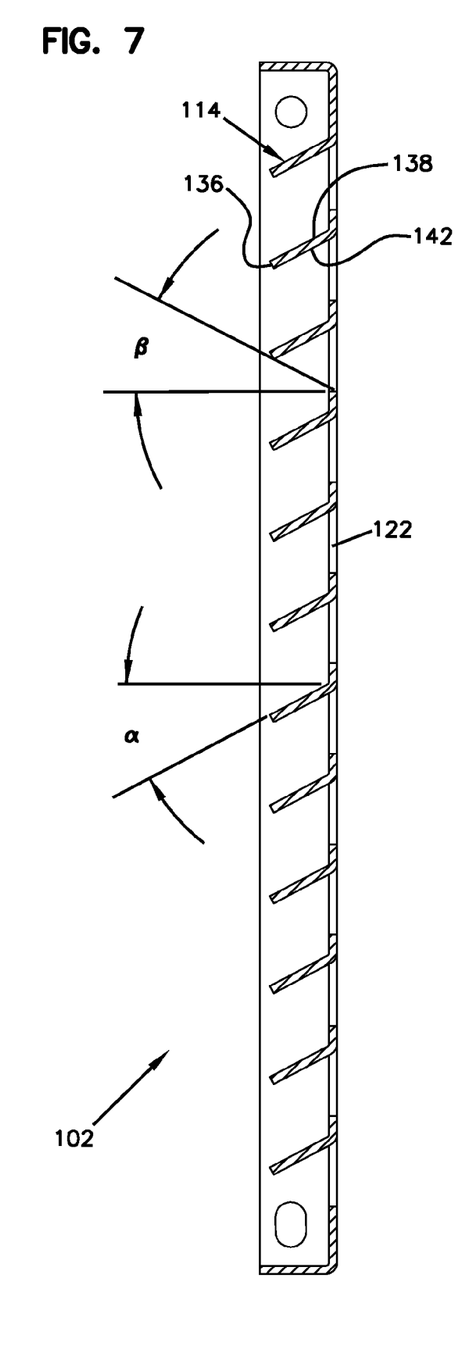
FIG. 7 is a cross-sectional side view of a light redirecting device according to one embodiment of the present disclosure.

Referring now to FIG. 7, a cross-sectional side view of the light redirecting device 102 of FIGS. 5-6 is illustrated. As shown, the slats 119 may extend from the front face 117 before terminating at a front edge 136, and define an incident surface 138 and an opposite surface 142. The surfaces 138, 142 may be smooth, jagged, serrated, knurled, combinations thereof, or otherwise treated to redirect light in a desired fashion. In one embodiment, at least the incident surfaces 138 of the slats 119 may be provided with one or more coatings or finishes configured to augment the reflective properties of the surfaces 138, thereby enhancing such surfaces ability to provide indirect lighting to a building space. For example, the surfaces 138 may be provided with an acrylic or fluoropolymer resin, or other acrylic, polyester, or urethane coating. Other finishes may also be provided. The surfaces 138 may be configured or otherwise treated to achieve specular reflectivity, diffuse reflectivity, or combinations thereof. In further embodiments, the opposite surfaces 142 may also be provided with one or more coatings or finishes configured to augment the reflective properties of the surfaces 142.

In some embodiments, the slats 119 may extend substantially normal to the front face 117 or, as shown in FIG. 7, may extend at an acute angle $\alpha$ relative to the front face 117. The slats 119 may each extend at the same angle, as shown, or one or more of the slats 119 may extend at different angles. By varying the angle $\alpha$, a desired path of the reflected light, or reflection pattern, may be achieved. For example, the angles $\alpha$ may be varied among the slats 119 to achieve a reflection pattern that provides indirect light to a building space over a focused area, a broad area, or in some other desired fashion.

Figure 7A:
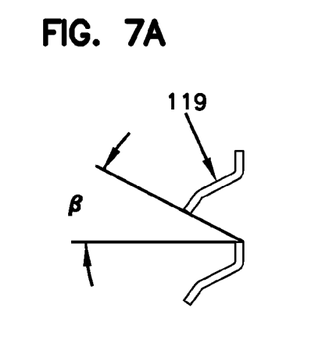
FIG. 7a is a cross-sectional side view of a light redirecting device according to one embodiment of the present disclosure.
Figure 7B:
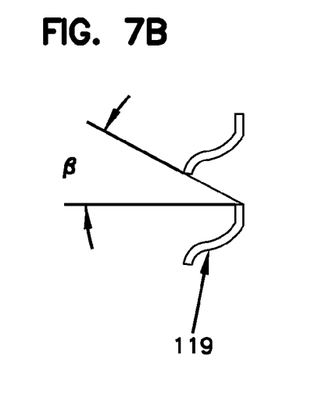
FIG. 7b is a cross-sectional side view of a light redirecting device according to one embodiment of the present disclosure.

In illustrative embodiments, the slats 119 may have a cross-section that is planar (as shown in FIG. 7), curved, or segmented such that it may be combinations thereof. For example, FIG. 7a illustrates slats 119 having a segmented cross-section that includes a first planar portion and a second planar portion. As an additional example, FIG. 7b illustrates slats 119 having a segmented cross-section that includes a first arcuate portion and a second arcuate portion. Other combinations of planar and arced segments may be provided. The slats 119 may have the same cross-sectional profile along their length, or the cross-sectional profiles may be varied. Moreover, each of the slats 119 of the device 102 may have the same cross-sectional profile, as shown, or one or more of the slats 119 may have a different cross-sectional profile relative to one or more of the others. As with the angle $\alpha$, a desired reflection pattern may be achieved by manipulating the shape of cross-sectional profiles.

In an alternative embodiment, one or more of the slat 119 may be movably mounted to the base member 116. For example, one or more of the slats 119 may be pivotably mounted to the base member 116. In this manner, the angle $\alpha$ of one or more of the slats 119 may be adjusted by a user of the device 102. As a further example, the slats 119 may be slidably mounted to the base member 116 such that the slats 119 may be raised and/or lowered relative to the base member 116. As yet another example, the slats 119 and the base member 116 may be collapsible such that an overall height of the device 102 may be adjusted.

In some embodiments, one or more openings 122 may be formed in and extend through the base member 116. Generally, the openings 122 may be configured and positioned to limit the amount of natural daylight that is able to pass directly through the device 102 while facilitating passage of light that is reflected from the slats 119. In this regard, one or more of the openings 122 may be provided above an individual slat 119 at a distance that accommodates passage of light reflected from the slat 119. The openings 122 may extend along the entire length of the slats 119, or may extend along only a portion of the length of the slats 119. In some embodiments, one or more adjacent openings 122 and slats 119 may define a maximum direct daylight angle $\beta$, which represents a maximum angle of daylight that will pass directly through the device 102 (i.e., pass through the device 102 without first reflecting from a slat 119). The angle $\beta$ may be varied as desired by, for example, varying a length of extension of the slats 119 from the front face 117, varying the angle of extension $\alpha$ of the slats 119 from the front face 117, and/or varying the width of the openings 122.

In some embodiments, the device 102 may include a flange member 124 for facilitating mounting of the device 102 within the chamber 114. For example, the flange member 124 may be configured for attachment to the spacer 108 of the IG unit 100. In this regard, the flange member 124 may extend along each edge of the device 102, portions thereof, or may be provided along only one or more of the edges of the device 102. The flange member 124 may extend from the front face 117, the rear face 118, or combinations thereof, and may extend substantially perpendicularly to the faces 117, 118, or at another angle that accommodates mounting of the device 102. In one embodiment, the flange member 124 may be integrally formed with respect to the base member 116 (i.e., the flange member 124 may be formed by a series of cuts and/or bends of the base member 116). Alternatively, the flange member 124 may be a separate component coupled to the base member 116 by means of adhesives, butt welding, plug welding, lap welding, riveting, nailing, gusseting, crimping, or the like. The flange member 124 may be provided with one or more perforations 144 for penetration thereof by screws, rivets, bolts, pins, or other fasteners, which may be secured to the spacer 108. As an alternative to a flange member 124, other mechanical mounting devices such as hangers, brackets, or other known mechanical devices for affixing objects to one another may be employed to mount the device 102 within the chamber 114. As a further alternative, the device 102 may be mounted within the chamber 114 using an adhesive or other bonding agent.

In various embodiments, the device 102 may be configured as a one-piece construction. That is, each of the slats 119, the openings 122, and the flange member 124 may be formed by a series of cuts and/or bends to a single sheet of starting material. By employing such a one-piece construction, the device 102 may be substantially void of seams, gaps, or other crevices that may trap finish material, debris, or other contaminants that may be applied to or otherwise be present during the manufacture of the device 102. Such one-piece construction may further eliminate the need for any attachment facilitating materials such as adhesives or bonding agents. The absence of such materials may be particularly desirable in embodiments in which the presence of such materials would have a deleterious affect on components within the chamber 114 of the IG unit 100 such as, thin-film coatings applied to either or both of the #2 and #3 surfaces. Alternatively, the device 102 may be configured as a plurality of separate components coupled together.

In some embodiments, the device 102 may be mounted within the chamber 114 such that the front face 117 of the device 102 is facing the #2 surface (i.e., the front face 117 faces the incoming natural daylight DL). By such mounting, the device 102 may be adapted to receive the incoming daylight and, via its slats 119 and openings 122, redirect the incoming light upward into a building space, thereby providing indirect lighting to a building space in a desired fashion.

In illustrative embodiments, the device 102 may be mounted within the chamber 114 such that a clearance or gap exists between the device 102 and the #2 and #3 surfaces 104b, 106a. In one embodiment, the clearance may be selected as a minimum distance that prevents contact between the device 102 and either of the lites 104, 106 taking into account, for example, wind loads, and other compressive forces that may be applied to the IG unit 100. Alternatively, any desired clearance between the device 102 and the #2 and #3 surfaces 104b, 106a may be selected.

In various embodiments, the device 102 may be dimensioned and shaped to extend over any portion or segment of the IG unit 100. For example, in one embodiment, the device 102 may dimensioned such that a width of the device 102, defined as the dimension of the device 102 that extends between the side edges 132a, 132b, is substantially equivalent to a width of the IG unit 100, and a length of the device 102, defined as the dimension of the device 102 that extends between the top and bottom edges 126, 128, is less than a length of the IG unit 100. In such an embodiment, the top edge 126 of the device 102 may be provided adjacent a top edge of the IG unit 100, the bottom edge 128 of the device 102 may be provided adjacent a bottom edge of the IG unit 100, or the device 102 may be provided spaced-apart from the top and bottom edges of the IG unit 100. Alternatively, the device 102 may extend over the entire IG unit 100, or the device 102 may be dimensioned such that it can be mounted spaced-apart from any one or more of the edges of the IG unit 100.

In illustrative embodiments, as an alternative or in addition to the light redirecting device 102, one or more other light redirecting components may be associated with the IG unit 100. For example, a polymeric film configured to redirect light that passes therethrough may be applied to a surface of the lites 104, 106. Alternatively, any other components known to redirect light may be employed.

In some embodiments, in addition to having one or more light redirecting devices, the IG unit 100 may include one or more surfaces, such as any or all of the #1, #2, #3, and #4 surfaces that is segmentally coated in accordance with the first inventive aspect of the present disclosure. In one embodiment, either or both of the #2 and #3 surfaces may be segmentally coated. In another embodiment, only the #2 surface may be segmentally coated. As with the segmentally coated surfaces discussed with respect to the first inventive aspect, a segmentally coated surface of the IG unit 100 may include a first coating applied to a first segment of the surface, and a second coating applied to a second segment of the surface, each of the first and second coatings imparting different properties or characteristics to the surface. In one embodiment, the first and second coatings applied to a surface of the IG unit may be configured such that a first surface segment, which corresponds to that area of the surface over which the first coating is applied, exhibits visible light transmission of about 60% or higher (is a "high transmission area"), and a second segment of the IG unit, which corresponds to that area of the surface over which the second coating is applied, exhibits visible light transmission of about 40% or lower (is a "low transmission area"). The first and second coatings may configured to vary any number of properties in addition to visible light transmission. As will be appreciated by those skilled in the art, the relative sizes of the high transmission area and the low transition areas may be selected to balance, as appropriate for the building space, the desire for increased indirect lighting with the desire to optimize the solar properties of the IG unit.

In various embodiments, the light redirecting device 102 may be sized, shaped, and/or positioned within the IG unit 100 based on the size, shape, and/or position of the high and low transmission areas of the IG unit 100. For example, the light redirecting device 102 may be configured and positioned to substantially overlap a portion of, up to the entirety of, the high transmission area (i.e., the device 102 and the high transmission area may have substantially the same "foot print"). By aligning the high transmission area and the light redirecting device 102, the amount of indirect lighting provided to the building space may be optimized. Alternatively, the size, shape, and/or position of the light redirecting device 102 and the high and low transmission areas may be determined independent of one another.

As previously discussed, the IG unit 100 may be mounted in a wall of a building. More specifically, the IG unit 100 may be mounted such that the lite 106 is adjacent an interior building space and the top edge 103 is nearest the ceiling of the interior building space. In such an embodiment, the high transmission area may be formed as an upper segment of the IG unit 100 (nearest the ceiling) and the low transmission area may be formed as a lower segment of the IG unit 100 (nearest the floor). For example, the position of the high transmission area may be selected such that it is above the so-called view area of the IG unit 100. Additionally, the light redirecting device 102 may be positioned substantially aligned with the high transmission area. By arranging the transmission areas and the light redirecting device 102 in this manner, through operation of a single IG unit, an adequate amount of indirect lighting may be provided to the interior building space while at the same time achieving improved solar performance relative to an IG unit bearing a high transmission coating over an entire surface of one of its lites.

Figure 8:
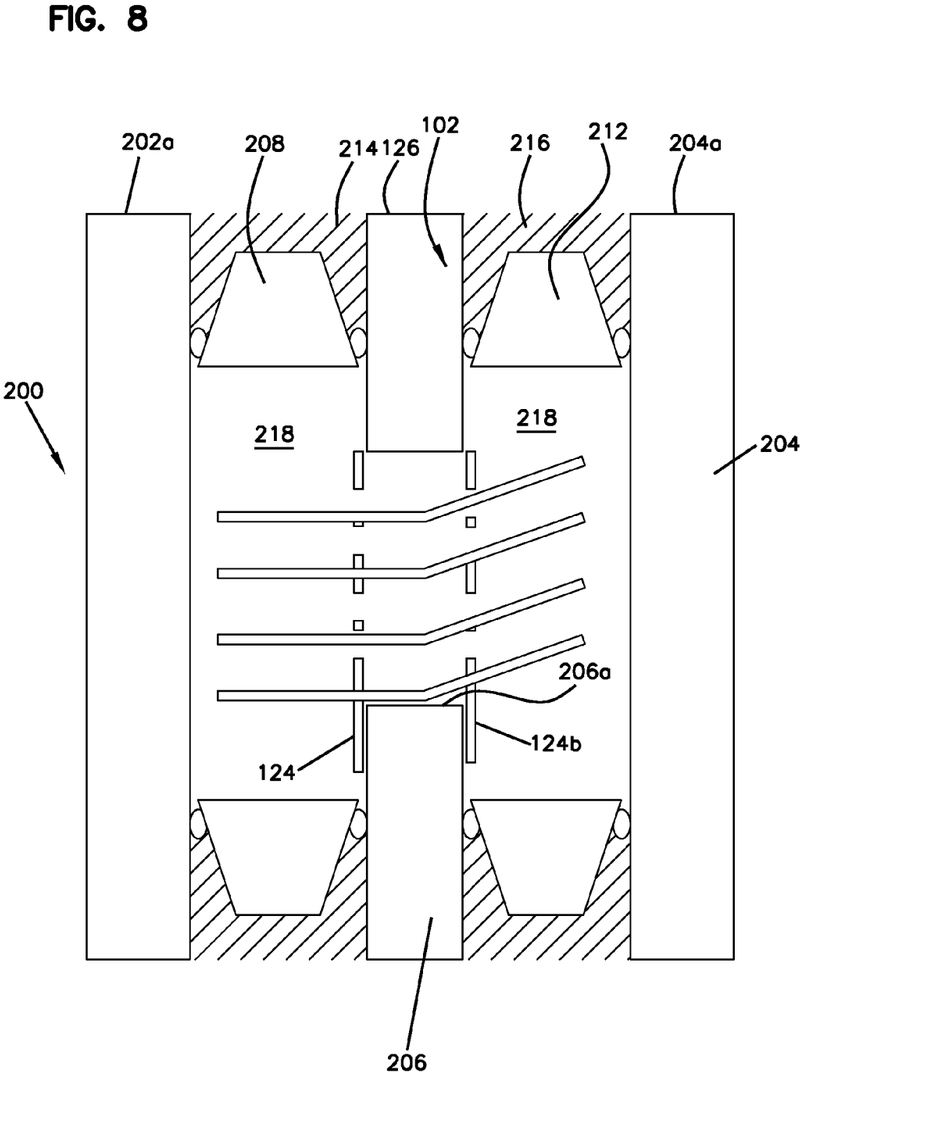
FIG. 8 is a schematic diagram of a cross-sectional side view of an insulating glass unit having a light redirecting device associated therewith according to one embodiment of the present disclosure

Referring now to FIG. 8, an IG unit 200 having a light redirecting device 102 positioned therein in accordance with an alternative embodiment of the present disclosure is illustrated. The IG unit 200 may be configured as a three-sheet window having an exterior lite 202, an interior lite 204, and a middle lite 206, provided in a spaced-apart relationship by spacers 208, 212, and sealed at their peripheral edges by sealants 214, 216 to form a sealed chamber 218. A low-conductance gas, such as argon, air, krypton, or the like, may be present in the sealed chamber 218. As shown, the device 102 may be mounted within the sealed chamber 218 such that its top edge 126 is substantially coplanar with top edges 202a, 204a of the lites 202, 204. In this regard, an upper segment of the device 102 may be provided above the sealed chamber 218. In the embodiment of FIG. 8, the device 102 may be mounted within the IG unit 200 without the use of a fastening device. For example, the device 102 may be positioned within the IG unit 200 such that it is supported vertically by a top edge 206a of the middle lite 206, and is supported laterally, on an upper segment, by the spacers 208, 212, and on a lower segment by downwardly extending flange members 124a, 124b of the device 102 that straddle the top edge 206a of the middle lite 206. Alternatively, or additionally, the device 102 may be secured to either or both of the spacers 208, 212 with one or more screws, rivets, bolts, pins, or other fasteners.

Figure 9:
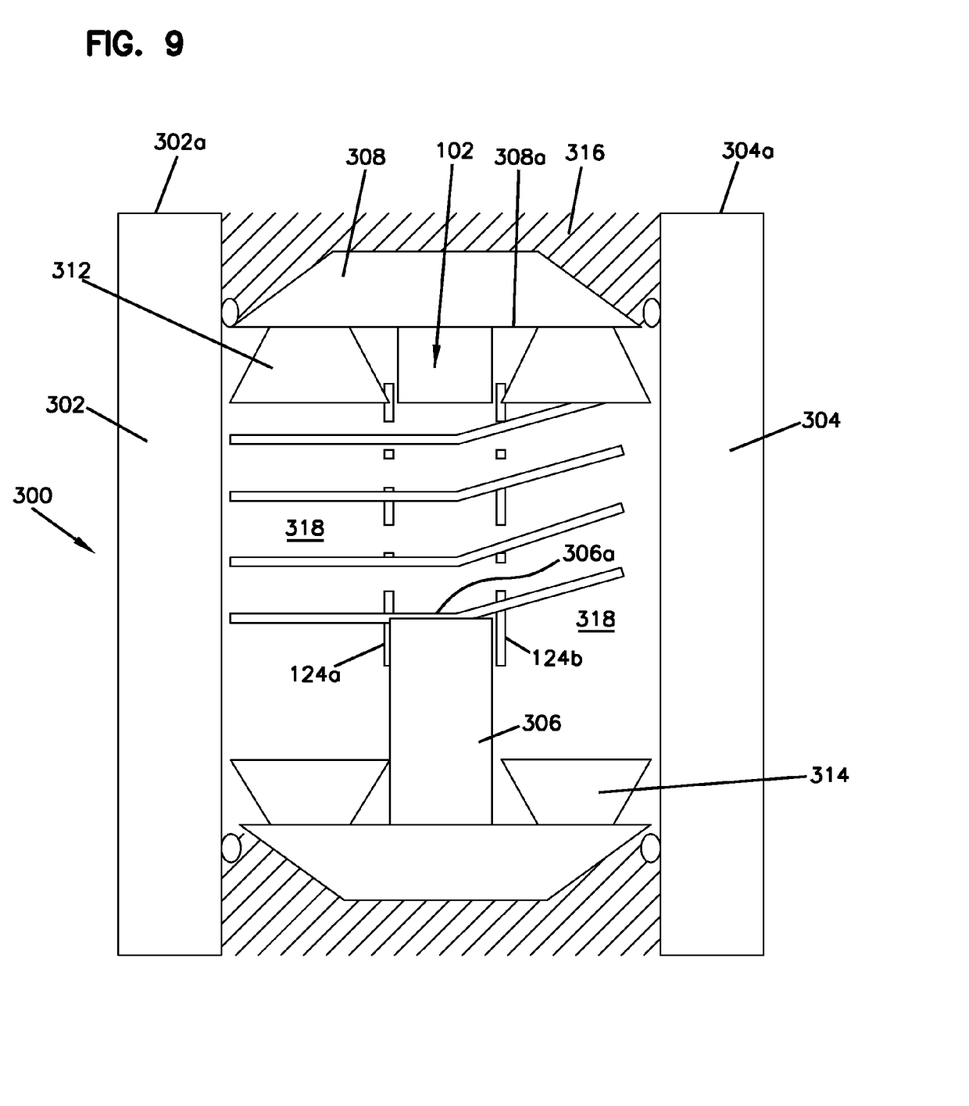
FIG. 9 is a schematic diagram of a cross-sectional side view of an insulating glass unit having a light redirecting device associated therewith according to one embodiment of the present disclosure.

Referring now to FIG. 9, an IG unit 300 having a light redirecting device 102 positioned therein in accordance with an alternative embodiment of the present disclosure is illustrated. The IG unit 300 may be configured as a three-lite window having an exterior lite 302, an interior lite 304, and a middle lite 306. The exterior lite 302 and the interior lite 304 may be provided in a spaced-apart relationship by spacer 308. The middle sheet 306 may be provided in spaced-apart relationship from the exterior lite 302 and the interior lite 304 by sub-frames, or sub-spacers 312 and 314, respectively. The IG unit 300 may be sealed at its peripheral edges by sealants 316 to form a sealed chamber 318. A low-conductance gas, such as argon, air, krypton, or the like, may be present in the sealed chamber 318. In contrast to the embodiment of FIG. 8, the device 102 may be mounted within the sealed chamber 318 such that its top edge 126 is positioned below top edges 302a, 304a of the lites 302, 304. As with the embodiment of FIG. 8, the device 102 may be mounted within the IG unit 300 without the use of a fastening device. For example, the device 102 may be positioned within the IG unit 300 such that it is supported vertically between a bottom edge 308a of the spacer 308 and a top edge 306a of the middle lite 306. The device 102 may be supported laterally, on an upper segment, by the sub-spacers 312, 314, and on a lower segment by downwardly extending flange members 124a, 124b of the device 102 that straddle the top edge 306a of the middle lite 306. Alternatively, or additionally, the device 102 may be secured to either or both of the sub-spacers 312, 314 with one or more screws, rivets, bolts, pins, or other fasteners.

In the foregoing description various embodiments of the present disclosure have been presented for the purpose of illustration and description. They are not intended to be exhaustive or to limit the invention to the precise form disclosed. Obvious modifications or variations are possible in light of the above teachings. The embodiments were chosen and described to provide the best illustration of the principals of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth they are fairly, legally, and equitably entitled.

What is claimed is:

1. A method of producing coated substrates, the method comprising:
   a) providing a substrate having a top edge, a bottom edge, a plurality of side edges, and a major surface extending between the top edge, the bottom edge, and the plurality of side edges;
   b) depositing upon a first surface segment of said major surface a first coating, the first segment extending between the plurality of side edges from the top edge to a first boundary located between the top edge and the bottom edge;
   c) depositing upon a second surface segment of said major surface a second coating, the second segment extending inwardly from the plurality of side edges and the bottom edge to a second boundary located between the bottom edge and the top edge; and
   d) depositing at least some of one or more of the first coating or the second coating in a graded thickness in a transitional surface segment on the major surface extending between the first boundary and the second boundary, the graded thickness of the first coating transitioning to a full thickness at the first surface segment and the graded thickness of the second coating transitioning to a full thickness at the second surface segment;
   wherein the first coating provides a different light transmittance than the second coating.

2. The method of claim 1, wherein depositing upon a first segment further comprises depositing a first coating comprising a first layering system comprising a plurality of layers and depositing upon the second surface segment further comprises depositing a second layering system comprising a plurality of layers.

3. The method of claim 2, wherein either or both of the first coating and the second coating are low-emissivity coatings.

4. The method of claim 3, wherein both of the first coating and the second coating are low-emissivity coatings.

5. The method of claim 4, wherein some of the plurality of the layers of the first and second layering systems are substantially identical and one or more layer differences are present in the first layering system relative to the second layering system.

6. The method of claim 5, wherein the one or more layer differences comprise one or more additional layers, one or more fewer layers, one or more layers having greater thickness, one or more layers having lesser thickness, and/or one or more layers of a different material.

7. The method of claim 6, wherein the one or more layer differences occur gradually over the transitional surface segment.

8. The method of claim 6, wherein the first surface segment has a visible light transmission of about 60% or more, and the second surface segment has a visible light transmission that is less than the visible light transmission of the first surface segment.

9. The method of claim 8, wherein the second surface segment has a visible light transmission of about 40% or less.

10. The method of claim 9, wherein the second surface segment has a solar heat gain coefficient that is less than the solar heat gain coefficient of the first surface segment.

11. The method of claim 9, wherein the first surface segment is between about 10% and about 40% of the total surface area of the major surface.

12. The method of claim 10, wherein the first surface segment is between about 10% and about 40% of the total surface area of the major surface.

13. The method of claim 2, wherein the substrate is formed of a transparent, substantially transparent, or light transmissive material.

14. The method of claim 2, wherein the substrate is float glass.

15. The method of claim 2, wherein the first and second coatings are deposited by magnetron sputtering.

16. The method of claim 6, wherein the one or more layer differences are achieved by selectively placing one or more objects between a sputtering target and the major surface.

17. The method of claim 6, wherein the one or more layer differences are achieved by manipulating the types, volumes, directions, and/or source locations of reactive and/or inert gases within a sputtering chamber.

* * * * *